(12) United States Patent
Wakiyama et al.

(10) Patent No.: US 10,930,695 B2
(45) Date of Patent: Feb. 23, 2021

(54) SEMICONDUCTOR DEVICE AND METHOD OF MANUFACTURING THE SAME

(71) Applicant: SONY SEMICONDUCTOR SOLUTIONS CORPORATION, Kanagawa (JP)

(72) Inventors: Satoru Wakiyama, Kanagawa (JP); Kan Shimizu, Kanagawa (JP); Toshihiko Hayashi, Kanagawa (JP); Takuya Nakamura, Kumamoto (JP); Naoki Jyo, Nagasaki (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 56 days.

(21) Appl. No.: 15/767,944

(22) PCT Filed: Oct. 7, 2016

(86) PCT No.: PCT/JP2016/079894
§ 371 (c)(1),
(2) Date: Apr. 12, 2018

(87) PCT Pub. No.: WO2017/068997
PCT Pub. Date: Apr. 27, 2017

(65) Prior Publication Data
US 2018/0308891 A1    Oct. 25, 2018

(30) Foreign Application Priority Data

Oct. 21, 2015    (JP) .................................. 2015-207233

(51) Int. Cl.
*H01L 27/146* (2006.01)
*H01L 23/00* (2006.01)
*H01L 23/31* (2006.01)

(52) U.S. Cl.
CPC ........ *H01L 27/14636* (2013.01); *H01L 24/03* (2013.01); *H01L 24/05* (2013.01);
(Continued)

(58) Field of Classification Search
CPC ... H01L 27/14636; H01L 24/03; H01L 24/05; H01L 24/06; H01L 24/14; H01L 24/81;
(Continued)

(56) References Cited

U.S. PATENT DOCUMENTS 6,002,765 A * 12/1999 Frank ...................... H04M 1/06
379/446
6,225,699 B1 * 5/2001 Ference ................. H01L 24/10
257/737

(Continued)

FOREIGN PATENT DOCUMENTS

| JP | H07-235620 | 9/1995 |
| JP | H09-102514 | 4/1997 |

(Continued)

OTHER PUBLICATIONS

International Search Report and Written Opinion prepared by the European Patent Office dated Dec. 22, 2016, for International Application No. PCT/JP2016/079894.

(Continued)

*Primary Examiner* — Hrayr A Sayadian
(74) *Attorney, Agent, or Firm* — Sheridan Ross P.C.

(57) ABSTRACT

An imaging device includes a first semiconductor element including at least one bump pad that has a concave shape. The at least one bump pad includes a first metal layer and a second metal layer on the first metal layer. The imaging device includes a second semiconductor element including at least one electrode. The imaging device includes a microbump electrically connecting the at least one bump pad to the at least one electrode. The microbump includes a (Continued)

diffused portion of the second metal layer, and first semiconductor element or the second semiconductor element includes a pixel unit.

20 Claims, 18 Drawing Sheets

(52) U.S. Cl.
CPC .............. *H01L 24/06* (2013.01); *H01L 24/14* (2013.01); *H01L 24/81* (2013.01); *H01L 27/14607* (2013.01); *H01L 27/14634* (2013.01); *H01L 27/14643* (2013.01); *H01L 23/3192* (2013.01); *H01L 24/13* (2013.01); *H01L 24/16* (2013.01); *H01L 24/48* (2013.01); *H01L 2224/0239* (2013.01); *H01L 2224/039* (2013.01); *H01L 2224/0345* (2013.01); *H01L 2224/0346* (2013.01); *H01L 2224/0361* (2013.01); *H01L 2224/0391* (2013.01); *H01L 2224/03616* (2013.01); *H01L 2224/03828* (2013.01); *H01L 2224/0401* (2013.01); *H01L 2224/04042* (2013.01); *H01L 2224/05009* (2013.01); *H01L 2224/05082* (2013.01); *H01L 2224/05157* (2013.01); *H01L 2224/05181* (2013.01); *H01L 2224/05187* (2013.01); *H01L 2224/05547* (2013.01); *H01L 2224/05548* (2013.01); *H01L 2224/05571* (2013.01); *H01L 2224/05644* (2013.01); *H01L 2224/05647* (2013.01); *H01L 2224/05655* (2013.01); *H01L 2224/05664* (2013.01); *H01L 2224/05669* (2013.01); *H01L 2224/0603* (2013.01); *H01L 2224/06181* (2013.01); *H01L 2224/131* (2013.01); *H01L 2224/13111* (2013.01); *H01L 2224/1403* (2013.01); *H01L 2224/16145* (2013.01); *H01L 2224/16146* (2013.01); *H01L 2224/48463* (2013.01); *H01L 2224/73257* (2013.01); *H01L 2224/81011* (2013.01); *H01L 2224/8114* (2013.01); *H01L 2224/81022* (2013.01); *H01L 2224/81065* (2013.01); *H01L 2224/8182* (2013.01); *H01L 2224/81191* (2013.01); *H01L 2224/81444* (2013.01); *H01L 2224/81447* (2013.01); *H01L 2224/81455* (2013.01); *H01L 2224/81464* (2013.01); *H01L 2224/81469* (2013.01); *H01L 2924/00014* (2013.01)

(58) Field of Classification Search
CPC ......... H01L 27/14607; H01L 27/14634; H01L 27/14643; H01L 23/3192; H01L 24/13; H01L 24/16; H01L 24/48; H01L 2224/0239; H01L 2224/0345; H01L 2224/0346; H01L 2224/0361; H01L 2224/03616; H01L 2224/03828; H01L 2224/039; H01L 2224/0391; H01L 2224/0401; H01L 2224/04042; H01L 2224/05009; H01L 2224/05082; H01L 2224/05157; H01L 2224/05181; H01L 2224/05187; H01L 2224/05547; H01L 2224/05548; H01L 2224/05571; H01L 2224/05644; H01L 2224/05647; H01L 2224/05655; H01L 2224/05664; H01L 2224/05669; H01L 2224/0603; H01L 2224/06181; H01L 2224/131; H01L 2224/13111; H01L 2224/1403; H01L 2224/16145; H01L 2224/16146; H01L 2224/48463; H01L 2224/73257; H01L 2224/81011; H01L 2224/81022; H01L 2224/81065; H01L 2224/8114; H01L 2224/81191; H01L 2224/81444; H01L 2224/81447; H01L 2224/81455; H01L 2224/81464; H01L 2224/81469; H01L 2224/8182; H01L 2924/00014
USPC .................................................. 257/291, 438
See application file for complete search history.

(56) References Cited

U.S. PATENT DOCUMENTS

| | | | |
|---|---|---|---|
| 6,781,586 B1 * | 8/2004 | Ohta | ..................... G06T 3/4007 |
| | | | 345/475 |
| 8,796,805 B2 | 8/2014 | Ting | |
| 2011/0304008 A1 | 12/2011 | Yang | |
| 2013/0277863 A1 | 10/2013 | Zhong | |
| 2015/0061102 A1 | 3/2015 | Lin | |
| 2016/0284753 A1 * | 9/2016 | Komai | .............. H01L 27/14634 |

FOREIGN PATENT DOCUMENTS

| | | | | |
|---|---|---|---|---|
| JP | 2003-041174 | | 5/2003 | |
| JP | 2005-057152 | | 3/2005 | |
| JP | 2006-108604 | | 4/2006 | |
| JP | 2006-237280 | | 9/2006 | |
| JP | 2011-049445 | | 3/2011 | |
| JP | 2011-198796 | | 10/2011 | |
| JP | 2013-008963 | | 1/2013 | |
| JP | 2014-143305 | | 8/2014 | |
| WO | WO 2015/093017 | | 6/2015 | |
| WO | WO-2015093017 A1 * | | 6/2015 | ....... H01L 27/14645 |
| WO | WO-2017-068997 | * | 4/2017 | |

OTHER PUBLICATIONS

Official Action (no English translation available) for Japanese Patent Application No. 2015-207233, dated Oct. 3, 2019, 9 pages.

* cited by examiner

FIG. 8

| | FIRST METAL | | SECOND METAL | | THIRD METAL | | EVALUATION RESULT | |
|---|---|---|---|---|---|---|---|---|
| | FILM TYPE | THICKNESS (nm) | FILM TYPE | THICKNESS (nm) | FILM TYPE | THICKNESS (nm) | CONNECTABILITY | HIGH TEMPERATURE SHELF TEST |
| EXAMPLE 1 | TiN | 20 | Co | 270 | Cu | 200 | ○ | ○ |
| EXAMPLE 2 | TiN | 20 | Co | 100 | Cu | 200 | ○ | ○ |
| EXAMPLE 3 | TiN | 20 | Co | 30 | Cu | 200 | ○ | ○ |
| EXAMPLE 4 | TiN | 20 | Co | 270 | Cu | 80 | ○ | ○ |
| COMPARATIVE EXAMPLE 1 | Ti | 20 | Co | 270 | Cu | 200 | × | — |
| COMPARATIVE EXAMPLE 2 | TiN | 250 | — | — | Cu | 200 | × | — |
| COMPARATIVE EXAMPLE 3 | TiN | 20 | Co | 10 | Cu | 200 | × | — |

SEMICONDUCTOR DEVICE AND METHOD OF MANUFACTURING THE SAME

CROSS REFERENCE TO RELATED APPLICATIONS

This application is a national stage application under 35 U.S.C. 371 and claims the benefit of PCT Application No. PCT/JP2016/079894 having an international filing date of Oct. 7, 2016, which designated the United States, which PCT application claimed the benefit of Japanese Priority Patent Application JP 2015-207233 filed on Oct. 21, 2015, the disclosures of each of which are incorporated herein by reference.

TECHNICAL FIELD

The present disclosure relates to a semiconductor device and a method of manufacturing the same, and this especially relates to the semiconductor device in which electrodes of stacked semiconductor elements are electrically connected to each other by Sn-based solder and the method of manufacturing the same.

BACKGROUND ART

In related art, a method of forming a microbump of Sn-based solder (SnAg and the like) is used when the electrodes of the stacked semiconductor elements are connected to each other in a manufacturing step of the semiconductor device formed of the stacked semiconductor elements.

FIG. 1 illustrates an outline of the method of forming the microbump formed of the Sn-based solder used in the related art when stacking the semiconductor elements.

As illustrated in the FIG. 1, a position of an Al PAD 2 is opened on a side of a first semiconductor element 1 and Ni and the like is formed there as barrier metal 3. A microbump 6 formed of the Sn-based solder is formed on a side of a second semiconductor element 4 and the barrier metal 3 and the Sn-based solder 6 are connected in a diffusing manner by formic acid reduction.

FIG. 2 illustrates a theoretical diffusion distance with respect to time between Sn and a variety of types of metal which may be used as the barrier metal (at 200° C.). As is clear from the drawing, when connection in a diffusing manner by formic acid reduction is executed and considering diffusivity into the Sn-based solder, a thickness of the barrier metal 3 should be set on the order of micrometers (μm), specifically, not thinner than 3 μm.

However, in manufacturing the semiconductor device, it is difficult to allow the barrier metal 3 to flow on the order of μm.

Meanwhile, PTL 1 discloses die bond technology that adopts Ti as the barrier metal of the Sn-based solder and forms Ti of approximately 200 nanometers (nm) which may flow in the wafer process using a sputtering technique.

CITATION LIST

Patent Literature

PTL 1: JP 2006-108604 A

SUMMARY OF INVENTION

Technical Problem

However, the method disclosed in PTL 1 merely physically connects the semiconductor elements as the die bond technology, so that it becomes clear that high resistance due to alloy growth and oxidation occurs at the boundary between the Sn-based solder and Ti as a result of a high temperature shelf test performed by the applicant of the present disclosure. Therefore, it is understood that although the electrodes of the stacked semiconductor elements may be physically connected to each other, they are not electrically connected to each other by the method disclosed in PTL 1.

The present disclosure is achieved in view of such a condition and it is desirable that the electrodes of the stacked semiconductor elements are physically connected to each other.

Solution to Problem

According to a first aspect of the present disclosure, in a semiconductor device formed of stacked semiconductor elements in which electrodes of the opposed semiconductor elements are electrically connected to each other, a microbump formed of Sn-based solder is formed on an electrode of a second semiconductor element being one of the opposed semiconductor elements, and a concave bump pad opposed to the microbump is formed on an electrode of a first semiconductor element being the other of the opposed semiconductor elements connected to the electrode of the second semiconductor element through the microbump.

A third metal layer diffused into the microbump and a second metal layer formed of Co may be formed on the bump pad in this order from a side of the microbump.

A plurality of bump pads with different diameters may be provided on the first semiconductor element.

The diameters of the bump pads may be different from each other according to application of the electrodes to be connected.

A diameter of the microbump of the second semiconductor element may correspond to the diameter of the bump pad of the corresponding first semiconductor element.

The third metal layer, the second metal layer, and a first metal layer formed of TiN may be formed on the bump pad in this order from the side of the microbump.

An average thickness of the second metal layer may be set to 15 nm or thicker.

An average thickness of the first metal layer may be set to 10 nm or thicker.

The first metal layer may be formed of TiN, Ta, or TaN.

The third metal layer may be formed of Cu, Ni, Pd, Au, or Pt.

The bump pad may be formed of an opening provided from a surface of the first semiconductor element to a penetration electrode in the first semiconductor element.

The bump pad may be formed of an opening provided from the surface of the first semiconductor element to metal wiring in the first semiconductor element.

The semiconductor device may be a stacked CMOS image sensor in which a logic chip corresponding to the second semiconductor element is connected by CoW connection to a pixel substrate corresponding to the first semiconductor element.

A method of manufacturing according to a second aspect of the present disclosure is a method of manufacturing a manufacturing device that manufactures a semiconductor device formed of stacked semiconductor elements in which electrodes of the opposed semiconductor elements are electrically connected to each other, the method including a microbump forming step of forming a microbump formed of Sn-based solder on an electrode of a second semiconductor element being one of the opposed semiconductor elements and a bump pad forming step of forming a concave bump pad opposed to the microbump on an electrode of a first semiconductor element being the other of the opposed semiconductor elements connected to the electrode of the second semiconductor element through the microbump by the manufacturing device.

The bump pad forming step may form a second metal layer formed of Co on the electrode of the first semiconductor element being the other of the opposed semiconductor elements connected to the electrode of the second semiconductor element through the microbump, form a third metal layer diffused into the microbump on the second metal layer, bring the microbump into contact with the third metal layer, reduce an oxide film on surfaces of the third metal layer and the microbump by heating treatment under a reduction atmosphere and diffuse the third metal layer into the microbump, thereby bringing the microbump into contact with the second metal layer, and electrically connect the electrodes of the first and second semiconductor elements.

The bump pad forming step may further form a passivation layer on the third metal layer of the first semiconductor element and etches the passivation layer to provide an opening in which the third metal layer is exposed.

The bump pad forming step may further form a first metal layer formed of TiN on the electrode of the first semiconductor element being the other of the opposed semiconductor elements connected to the electrode of the second semiconductor element through the microbump before forming the second metal layer.

The bump pad forming step may form the bump pad by providing an opening from a surface of the first semiconductor element to a penetration electrode in the first semiconductor element.

The bump pad forming step may form the bump pad by providing an opening from the surface of the first semiconductor element to metal wiring in the first semiconductor element.

Advantageous Effects of Invention

According to the first aspect of the present disclosure, the semiconductor device in which the electrodes of the first and second semiconductor elements are electrically connected may be obtained.

According to the second aspect of the present disclosure, the semiconductor device in which the electrodes of the first and second semiconductor elements are electrically connected may be obtained.

BRIEF DESCRIPTION OF DRAWINGS

FIG. 8 A view illustrating an example of materials and thicknesses of first to third metal layers.

DESCRIPTION OF EMBODIMENTS

Hereinafter, a best mode for carrying out the present disclosure (hereafter, referred to as an embodiment) is described in detail with reference to the drawings.

<Configuration Example of Semiconductor Device>

Figure 1:
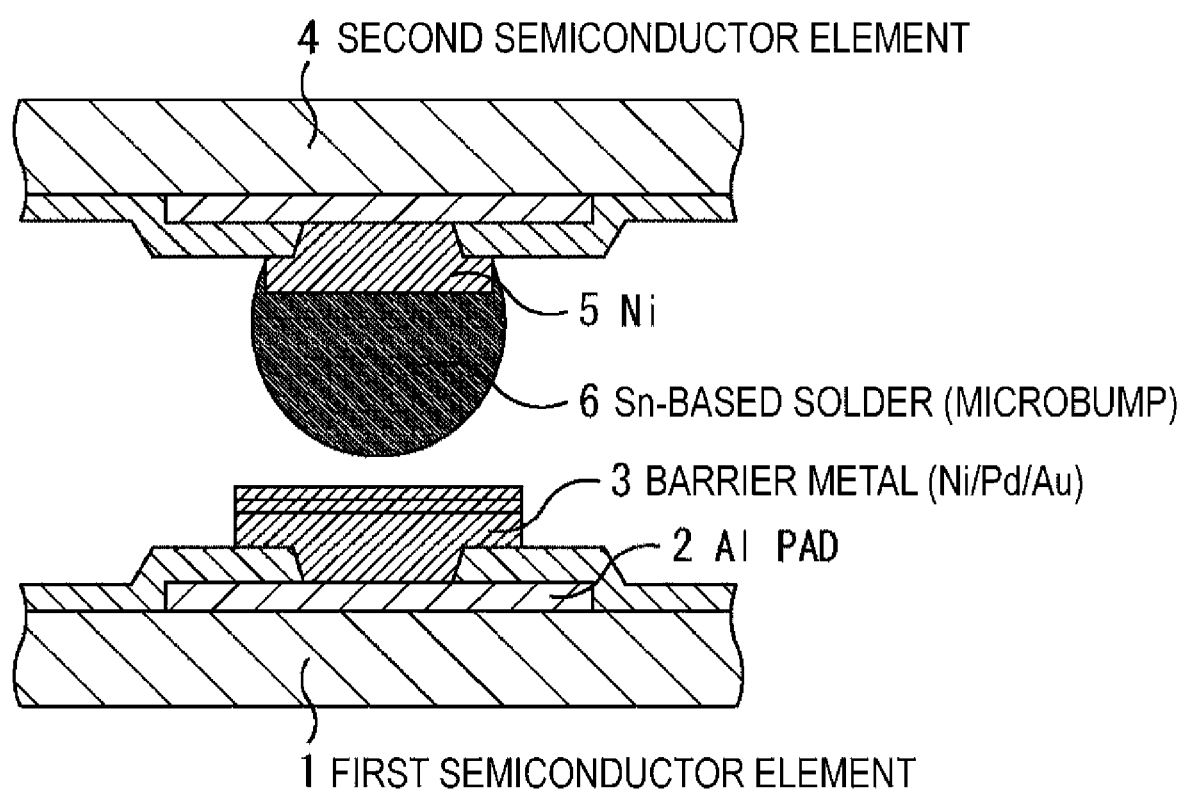
FIG. 1 A view for illustrating an outline of a method of using a microbump formed of Sn-based solder for connecting electrodes of stacked semiconductor elements.
Figure 2:
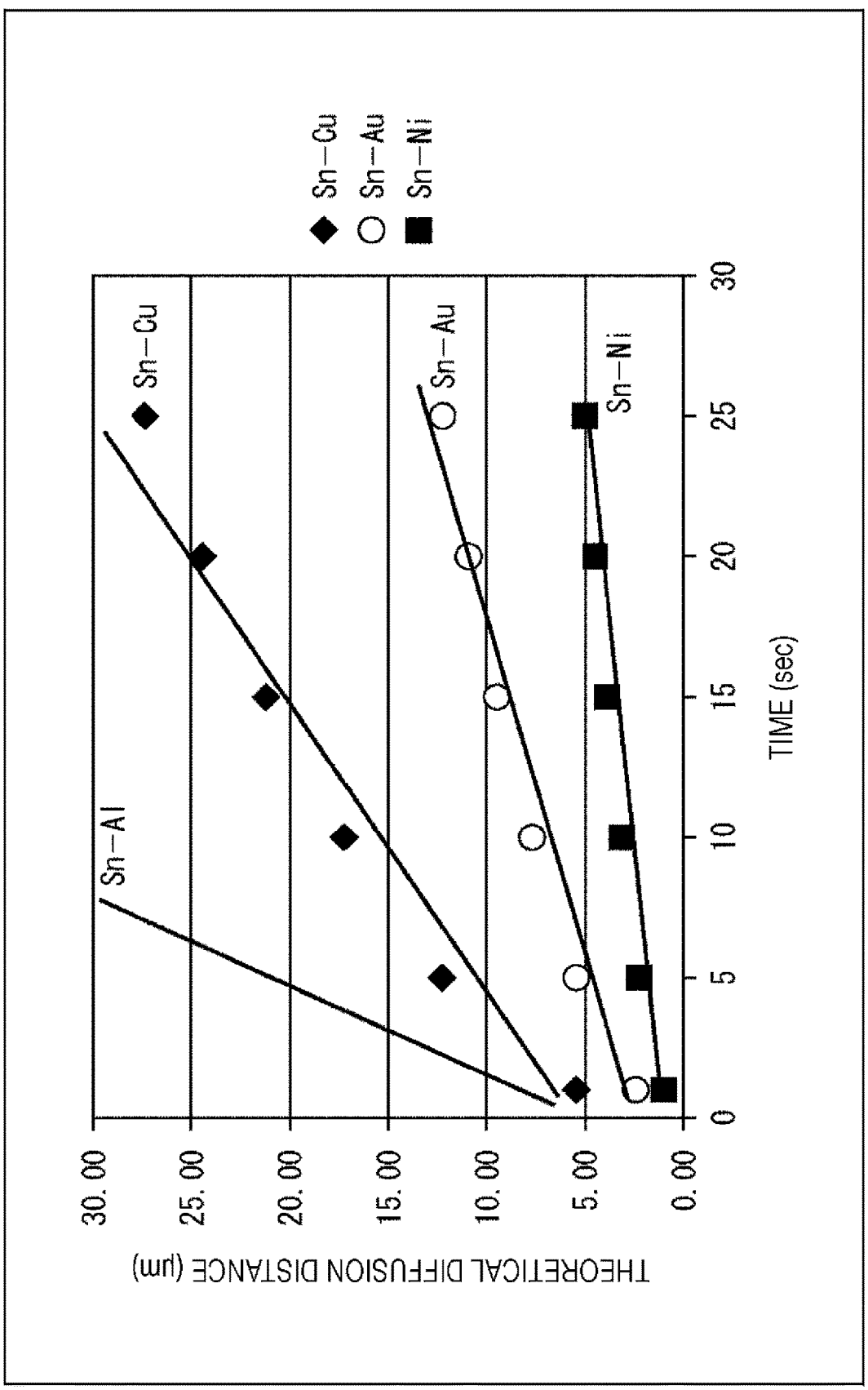
FIG. 2 A view illustrating a theoretical diffusion distance with respect to time between Sn and a variety of types of metal which may be used as barrier metal.
Figure 3:
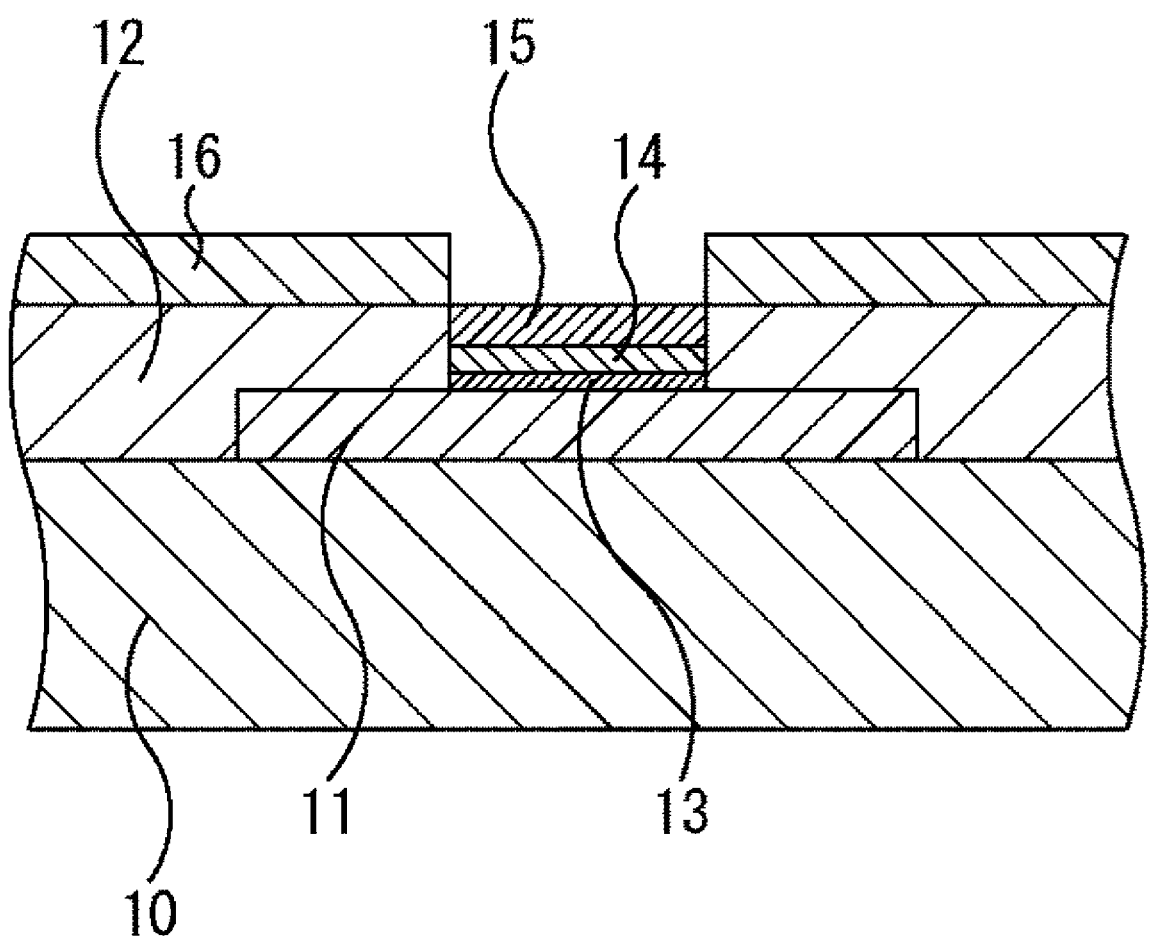
FIG. 3 A cross-sectional view illustrating a configuration example of a semiconductor device to which the present disclosure is applied.

FIG. 3 is a cross-sectional view illustrating a configuration example of a semiconductor device being an embodiment of the present disclosure. Note that this drawing illustrates only a side of a first semiconductor element on which a microbump is not formed out of the first semiconductor element and a second semiconductor element stacked to be electrically connected to each other with Sn-based solder.

Meanwhile, a Sn-base indicating a material of the solder includes a SnAg-base, a SnBi-base, a SnCu-base, a SnIn-base, a SnAgCu-base and the like.

As illustrated, an Al PAD 11 (or contact, or at least one contact) as an electrode is provided on a first semiconductor element 10, a part of the Al PAD 11 is formed into an opening 21 for connecting to the microbump on the second semiconductor element (FIGS. 5A-B), and a first metal layer 13, a second metal layer 14, and a third metal layer 15 are formed in this order on the opening 21. A $SiO_2$ layer (or insulation layer) 12 is formed on a portion other than the opening 21 and a SiN layer 16 is formed thereon. The layers 13, 14, and 15 are referred to here as first through third metal layers, respectively, for convenience of explanation. However, example embodiments are not limited thereto. For example, depending upon the embodiment, the first metal layer 13 may be referred to as a second metal layer or a third metal layer, the second metal layer 14 may be referred to as a first metal layer or a third metal layer, and the third metal layer 15 may be referred to as a first metal layer or a second metal layer. The same rationale applies other elements in the instant disclosure described as first, second, third, and so on.

TiN is adopted, for example, as the first metal layer 13 as barrier metal. An average thickness of the first metal layer 13 is set to approximately 10 nm or thicker. According to this, it becomes possible to form the first metal layer 13 in a wafer process line in which a particle risk may be especially reduced. Ta or TaN may also be adopted as the first metal layer.

It is possible to prevent reaction between the Al PAD 11 and the second metal layer 14, and between an alloy layer which might be generated by reaction between the Sn-based solder which forms the microbump of the second semiconductor element and the second metal layer 14 and the Al PAD 11 by providing the first metal layer (barrier metal) 13. According to this, improvement in reliability and electrical characteristics of the semiconductor device is expected. Meanwhile, the first metal layer 13 may also be omitted.

A material having a phase diagram with the Sn-based solder and low diffusivity, for example, Co is adopted as the second metal layer 14. An average thickness of the second metal layer 14 is set to approximately 15 nm or thicker. According to this, it becomes possible to form the second metal layer 14 in the wafer process line in which the particle risk may be especially reduced.

A material which may reduce a surface oxide film on a surface of the second metal layer 14 by non-cleaning flux, reduction gas and the like having high diffusivity into Sn, for example, Cu is adopted as the third metal layer 15. An average thickness of the third metal layer 15 is set to approximately 80 nm or thicker so as to prevent oxidation of the second metal layer 14. Ni, Pd, Au, Pt and the like may be adopted in addition to Cu as the third metal layer 15.

By adopting the above-described configuration, contact (reaction) between the Sn-based solder and the second metal layer 14 becomes easier even when Co which is significantly easily oxidized and relatively difficult to reduce is adopted as the material of the second metal layer 14. Further, it is possible to improve the reliability and electrical characteristics by adopting Co as the second metal layer 14.

<Method of Manufacturing Semiconductor Device>

Figure 5:
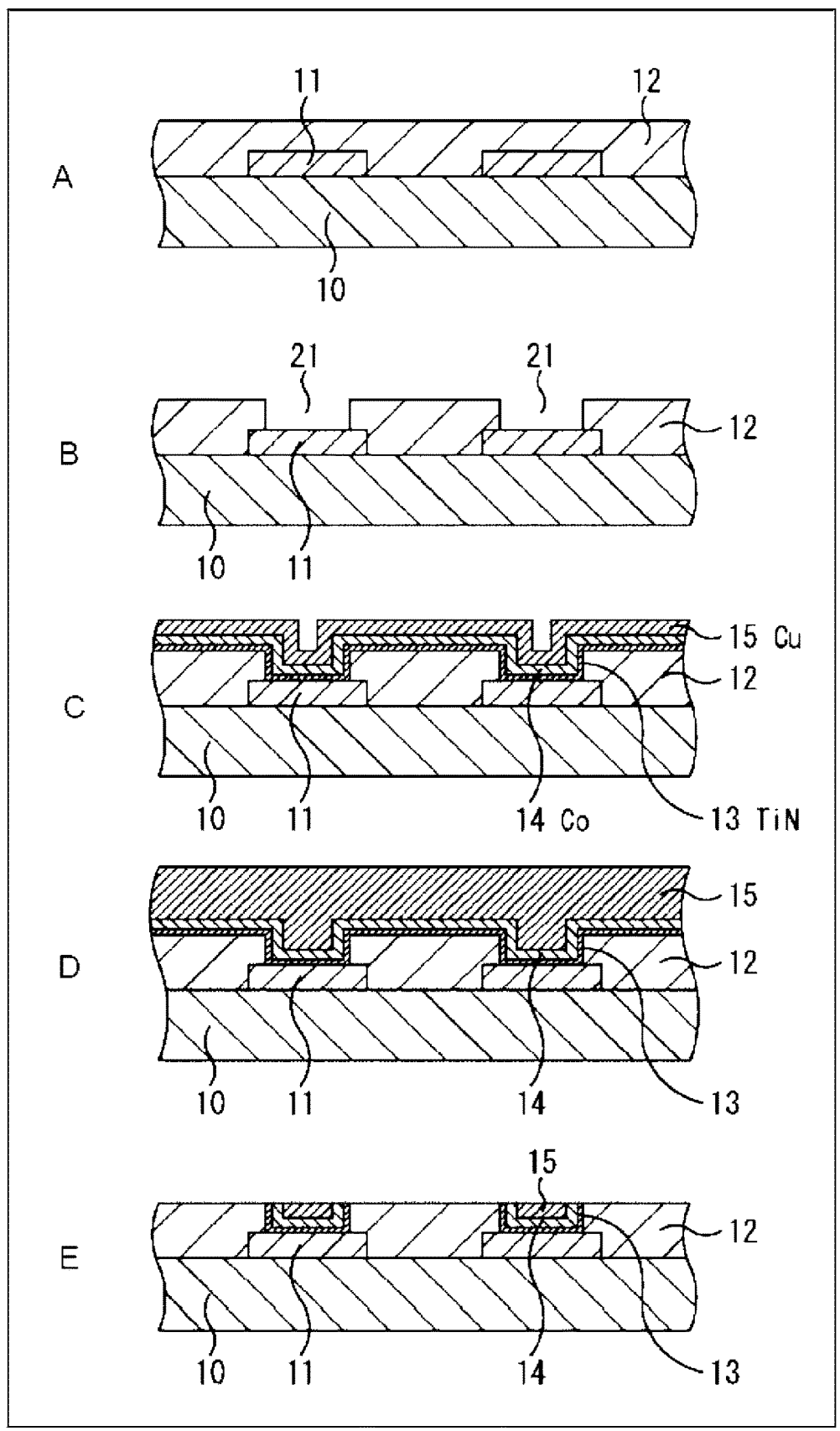
FIGS. 5A-E Cross-sectional views of the semiconductor device at a manufacturing step.
Figure 6:
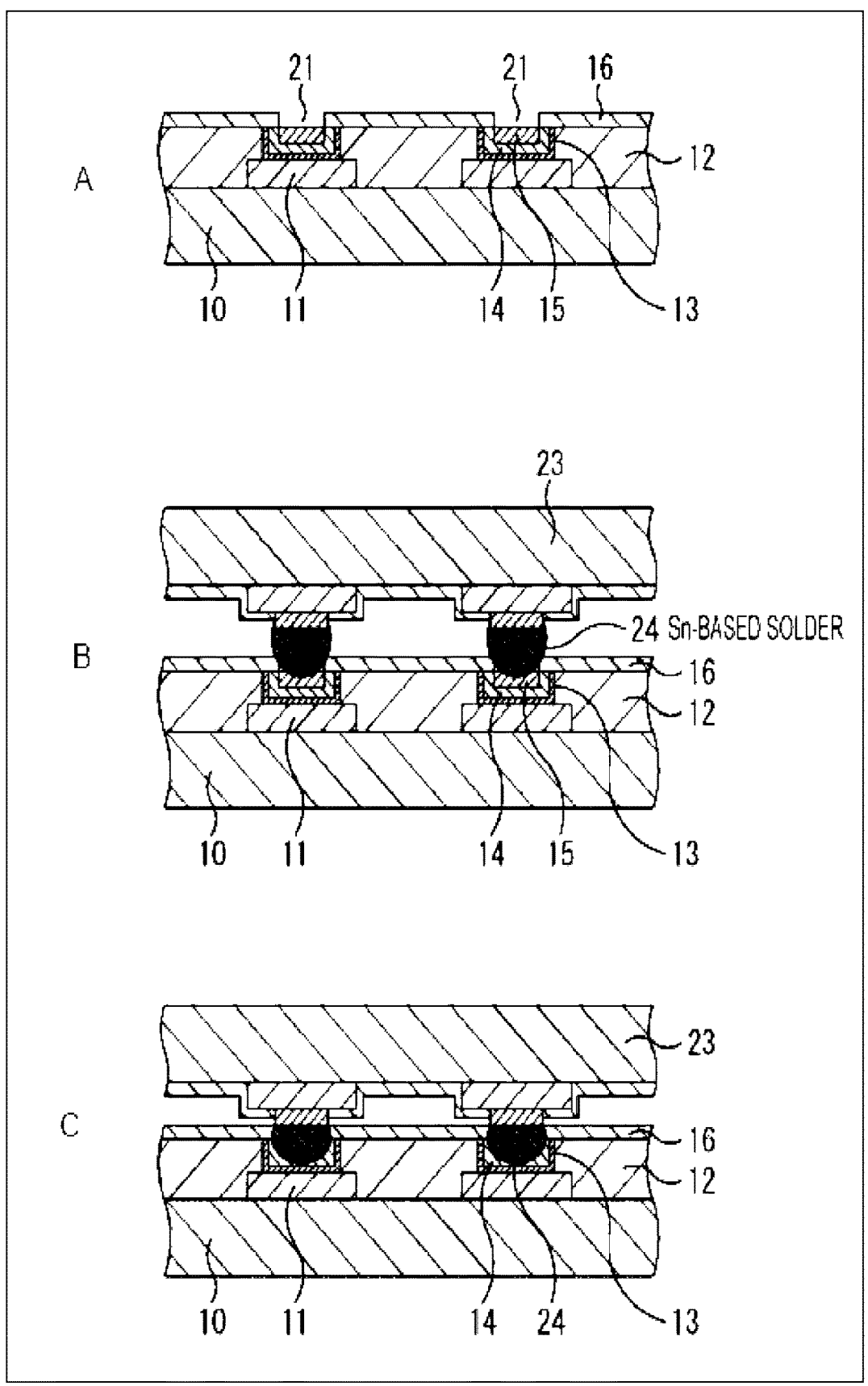
FIGS. 6A-C Cross-sectional views of the semiconductor device at a manufacturing step.

Next, a method of manufacturing the semiconductor device illustrated in FIG. 3 is described with reference to FIGS. 4 to 6.

Figure 4:
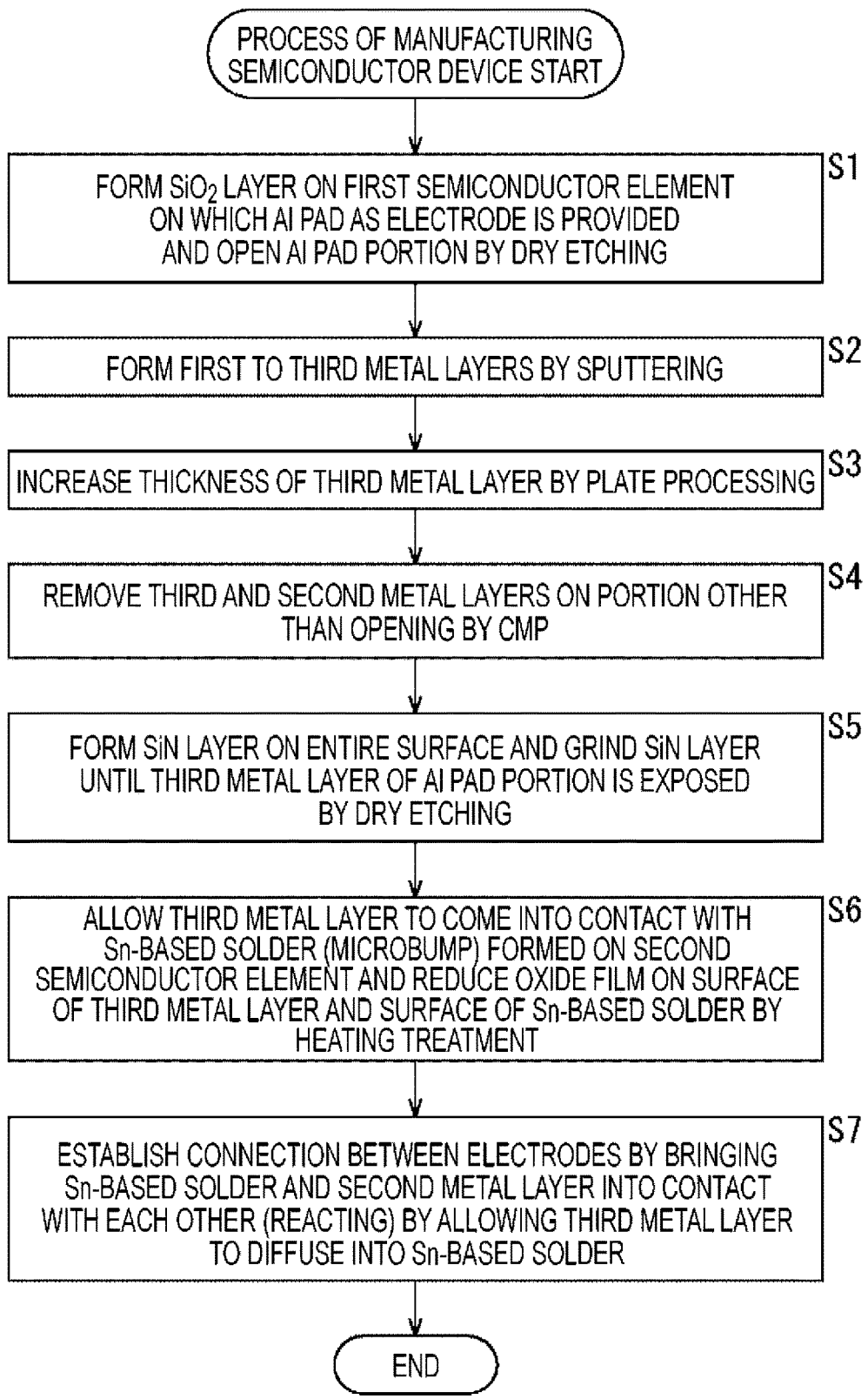
FIG. 4 A flowchart illustrating a method of manufacturing the semiconductor device in FIG. 3.

FIG. 4 is a flowchart illustrating the method of manufacturing the semiconductor device in FIG. 3. FIGS. 5A-E and 6A-C are cross-sectional views of the semiconductor device illustrating a manufacturing process.

At step S1, as illustrated in FIG. 5A, the $SiO_2$ layer 12 is formed on the first semiconductor element 10 on which the Al PAD 11 as the electrode is provided. Next, resist patterning (not illustrated) for protecting the portion other than the opening 21 according to a position and a diameter of the opening 21 to be described later is provided on the $SiO_2$ layer 12. Furthermore, as illustrated in FIG. 5B, the $SiO_2$ layer 12 is ground until the Al PAD 11 is exposed by dry etching and the opening 21 is provided.

At step S2, as illustrated in FIG. 5C, the first metal layer (TiN) 13, the second metal layer (Co) 14, and the third metal layer (Cu) 15 are formed by sputtering. Next, at step S3, as illustrated in FIG. 5D, a thickness of the third metal layer 15 is increased by a plating process of the same material as that of the third metal layer 15 (in this case, Cu) and a concave portion of the opening 21 is filled with the third metal layer 15. In other words, the third metal layer 15 is formed by a first deposition process and a second deposition process. The first deposition process forms a portion of the third metal layer 15 in the concave shape, and the second deposition process forms a remaining portion of the third metal layer 15 to fill the concave shape.

At step S4, as illustrated in FIG. 5E, the third metal layer 15 and the second metal layer 14 on the portion other than the opening 21 are removed or planarized by chemical mechanical polishing (CMP). At step S5, the SiN layer 16 as a passivation layer is formed on an entire surface and annealing treatment at 400° C./1 h, for example, is applied for Tr damage recovery. Further, the resist patterning (not illustrated) is provided on the SiN layer 16 and the SiN layer 16 is ground until the third metal layer 15 on the opening 21 is exposed by dry etching as illustrated in FIG. 6A. According to this, the opening 21 has a concave structure, so that positioning with a microbump 24 formed of the Sn-based solder formed on a second semiconductor element 23 becomes easy. Hereinafter, the opening 21 opposed to the microbump 24 is also referred to as a bump pad 21 (or at least one bump pad).

At step S6, as illustrated in FIG. 6B, the microbump 24 formed on the second semiconductor element 23 is brought into contact with the third metal layer 15 of the bump pad 21 and the oxide film on surfaces of the third metal layer 15 and the Sn-based solder forming the microbump 24 is reduced by heating treatment under a reduction atmosphere by formic acid and the like. Thereafter, at step S7, as illustrated in FIG. 6C, the third metal layer 15 is diffused into the Sn-based solder and the Sn-based solder is brought into contact (reacts) with the second metal layer 14, so that connection between the Al PAD 11 being the electrode of the first semiconductor element 10 and an electrode of the second semiconductor element 23 is established. The description of the manufacturing method ends.

<Kelvin Resistance Measurement Result in High Temperature Shelf Time>

Figure 7:
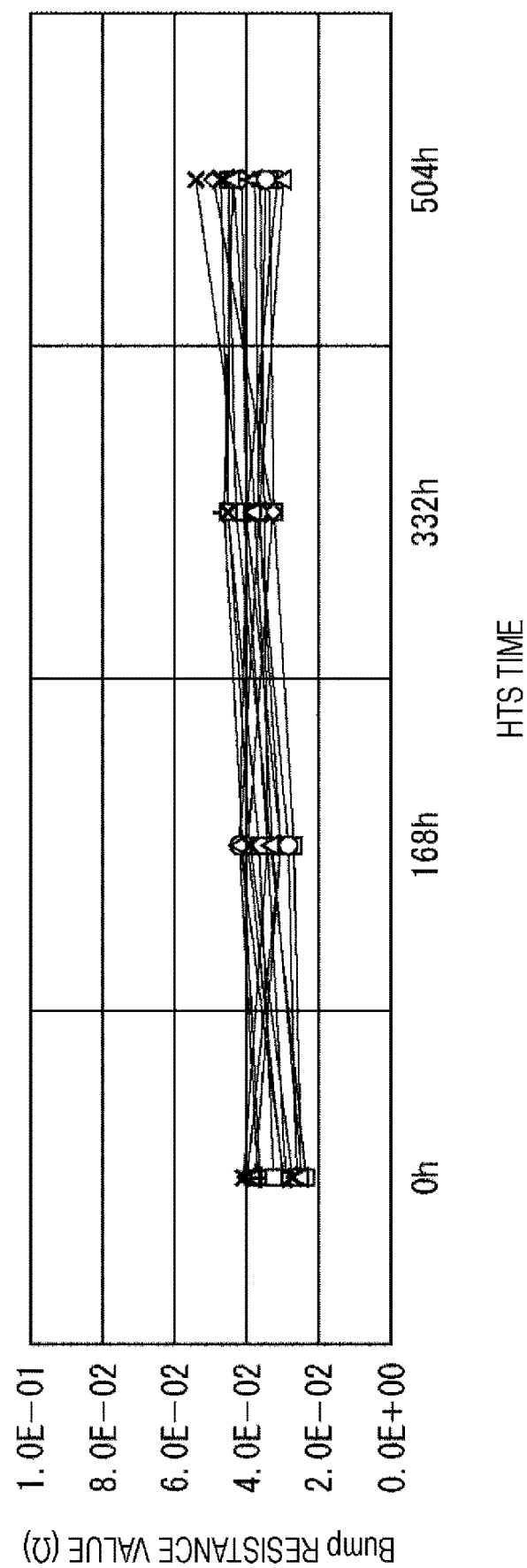
FIG. 7 A view illustrating a Kelvin resistance measurement result in 150° C. high temperature shelf time.

Next, FIG. 7 illustrates a Kelvin resistance measurement result in 150° C. high temperature shelf time when the second metal layer 14 is connected to the microbump 24 formed of the Sn-based solder when TiN, Co, and Cu are adopted as the first, second, and third metal layers 13, 14, and 15, respectively.

As illustrated in the drawing, a resistance value does not change after 504 hours. Therefore, the electrical connection between the electrodes of the first and second semiconductor elements 10 and 23 is maintained also after a lapse of time.

<Materials and Thicknesses of First, Second, and Third Metal Layers 13, 14, and 15>

Next, FIG. 8 illustrates evaluation in first to fourth examples and comparative examples (configurations disclosed in PTL 1) when the thickness of the second metal layer 14 and the material and thickness of the third metal layer 15 are changed.

In the first example, 20 nm TiN, 270 nm Co, and 200 nm Cu are adopted as the first, second, and third metal layers 13, 14, and 15, respectively. In the second example, 20 nm TiN, 100 nm Co, and 200 nm Cu are adopted as the first, second, and third metal layers 13, 14, and 15, respectively. In the third example, 20 nm TiN, 30 nm Co, and 200 nm Cu are adopted as the first, second, and third metal layers 13, 14, and 15, respectively. In the fourth example, 20 nm TiN, 270 nm Co, and 80 nm Cu are adopted as the first, second, and third metal layers 13, 14, and 15, respectively.

In any of the first to fourth examples, there is no problem in the result of connectability and the high temperature shelf test and physical and electrical connection between the electrodes of the first and second semiconductor elements 10 and 23 is established. Meanwhile, in the comparative example 1, the first metal layer Ti is diffused into Co of the second metal layer at the time of sintering annealing treatment introduced for the Tr damage recovery to prevent the connectability to the solder. In the comparative example 2, the connectability between the first metal layer TiN and the solder is not established. In the comparative example 3, the connectability to the solder is not secured even when the second metal layer Co is set to 10 nm.

<First Variation of Semiconductor Device>

Figure 9:
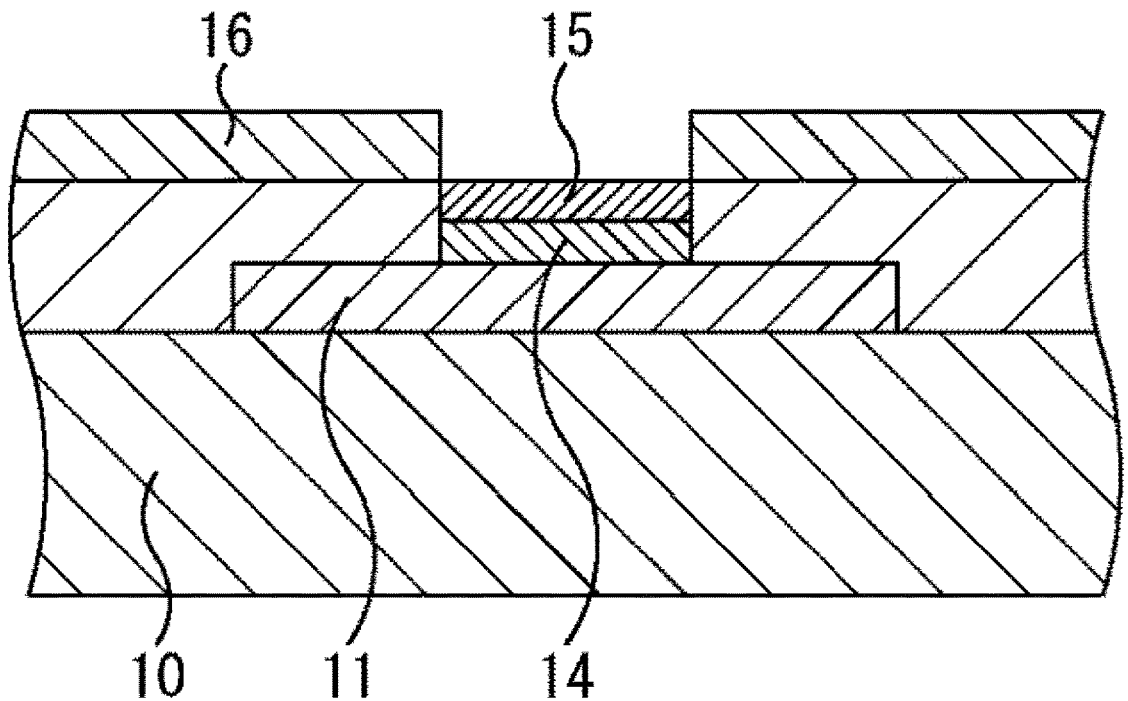
FIG. 9 A cross-sectional view of a first variation of a semiconductor device to which the present disclosure is applied.

FIG. 9 is a cross-sectional view illustrating a first variation of a semiconductor device being an embodiment of the present disclosure.

The first variation is obtained by omitting a first metal layer 13 from a configuration example illustrated in FIG. 3. According to this, process cycle time may be shortened and a cost may be reduced.

<Second Variation of Semiconductor Device>

Figure 10:
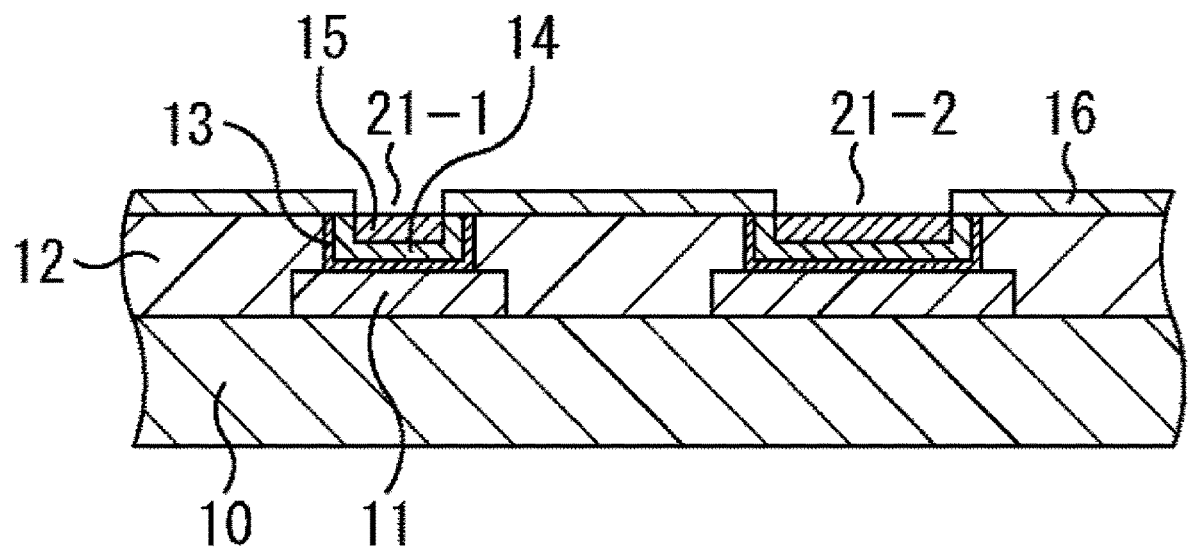
FIG. 10 A cross-sectional view of a second variation of a semiconductor device to which the present disclosure is applied.

Next, FIG. 10 is a cross-sectional view illustrating a second variation of a semiconductor device being an embodiment of the present disclosure.

The second variation is obtained by changing a diameter of a bump pad 21 provided on a first semiconductor element 10 according to application of an electrode (line) to be connected thereto. Two bump pads 21 provided on the first semiconductor element 10 are formed such that a bump pad 21-2 has a larger diameter than that of a bump pad 21-1.

Meanwhile, the diameters of a plurality of bump pads 21 provided on the same substrate (in this case, the first semiconductor element 10) may be easily changed by changing resist patterning provided on a $SiO_2$ layer 12 at step S1 of a manufacturing process described above and the resist patterning provided on a SiN layer 16 at step S5.

On the other hand, a diameter of a microbump 24 formed of Sn-based solder of a second semiconductor element is also changed according to the diameter of the corresponding bump pad 21.

<Change in Bump Capacity according to Difference of Diameters of Bump Pad 21 and Microbump 24>

Figure 11:
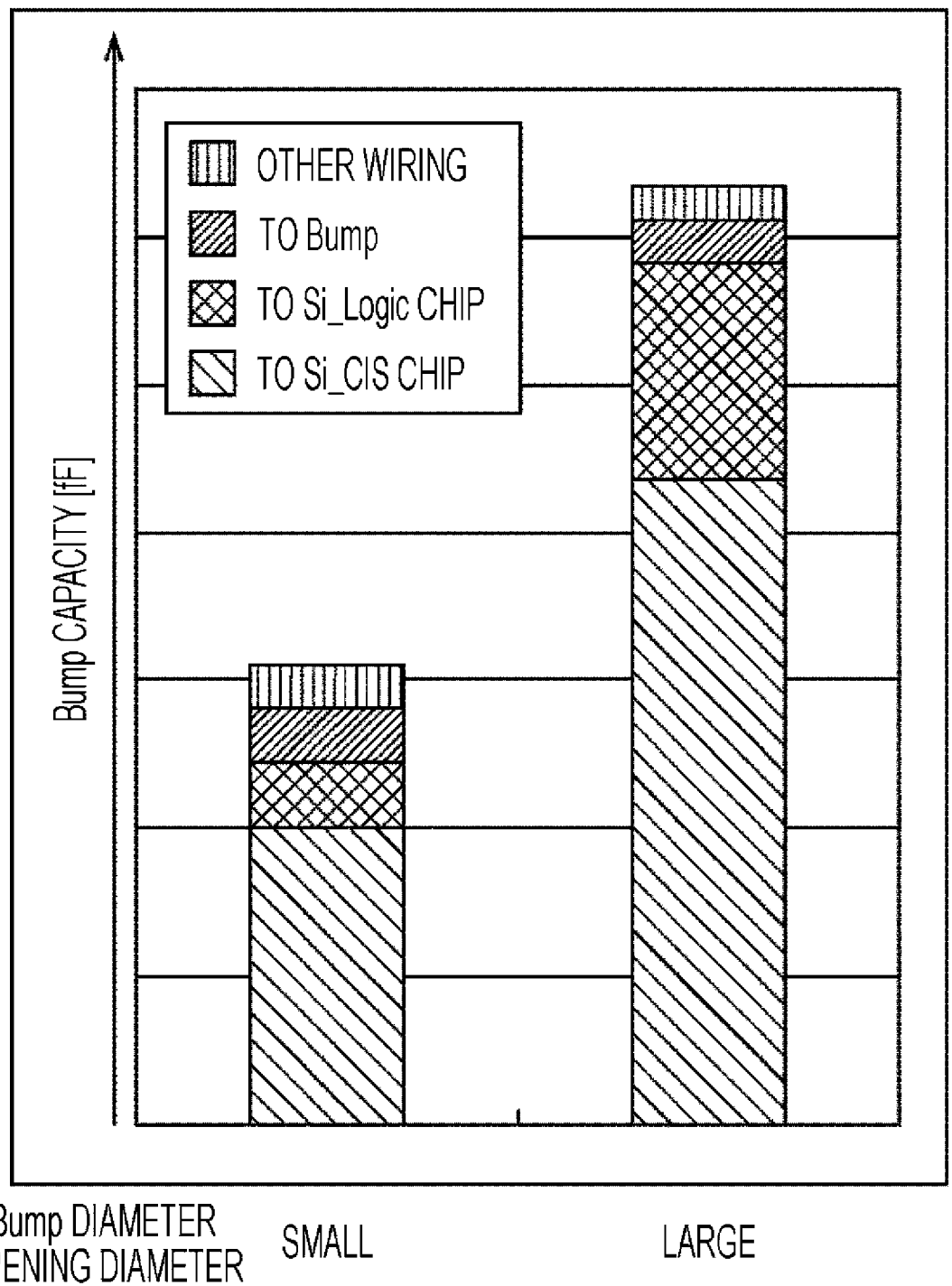
FIG. 11 A view illustrating a relationship between diameters of a bump pad and a microbump and a bump capacity.

FIG. 11 illustrates change in bump capacity according to difference of the diameter of the bump pad 21 (opening diameter) and the diameter of the microbump.

As illustrated in the drawing, when a case in which the diameters of the bump pad 21 and the microbump 24 are small is compared with a case in which they are large, the bump capacity is smaller in the case in which they are small. Therefore, when a signal line is connected by using the bump pad 21 and the microbump 24 having the small diameters, improvement in signal characteristics of an electrical signal to be communicated is expected. Furthermore, in this case, routing of wiring to be connected is easy.

<Change in Resistance Value according to Difference of Diameters of Bump Pad 21 and Microbump 24>

Figure 12:
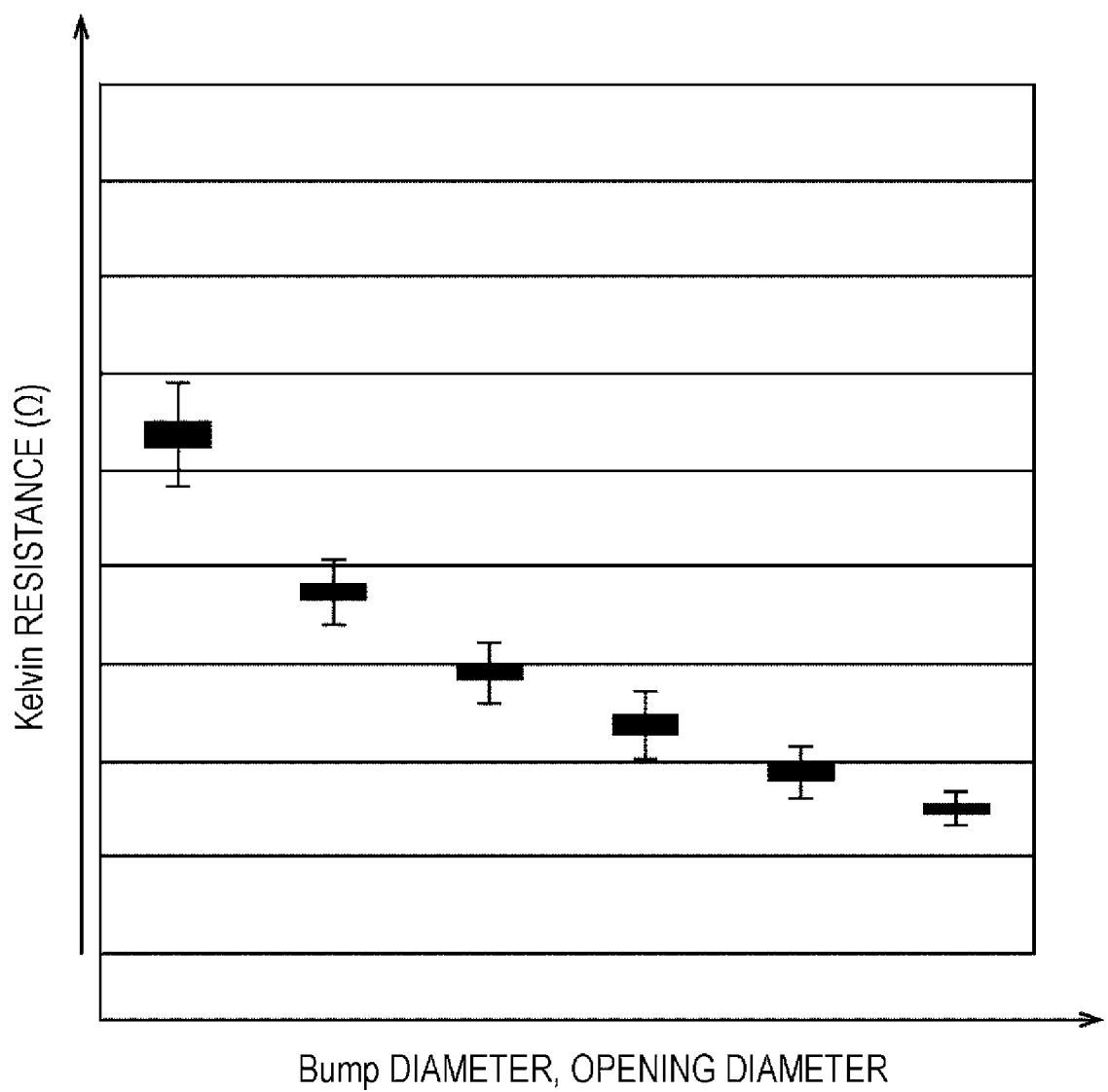
FIG. 12 A view illustrating a relationship between the diameters of the bump pad and the microbump and a resistance value.

FIG. 12 illustrates change in resistance value according to difference of the diameter of the bump pad 21 (opening diameter) and the diameter of the microbump 24.

As illustrated in the drawing, the larger the diameters of the bump pad 21 and the microbump 24, the smaller the resistance value. Therefore, when a power supply line is connected by using the bump pad 21 and the microbump 24 having larger diameters, a defect regarding power supply such as IR drop may be inhibited.

<Application Example of Second Variation of Semiconductor Device>

Figure 13:
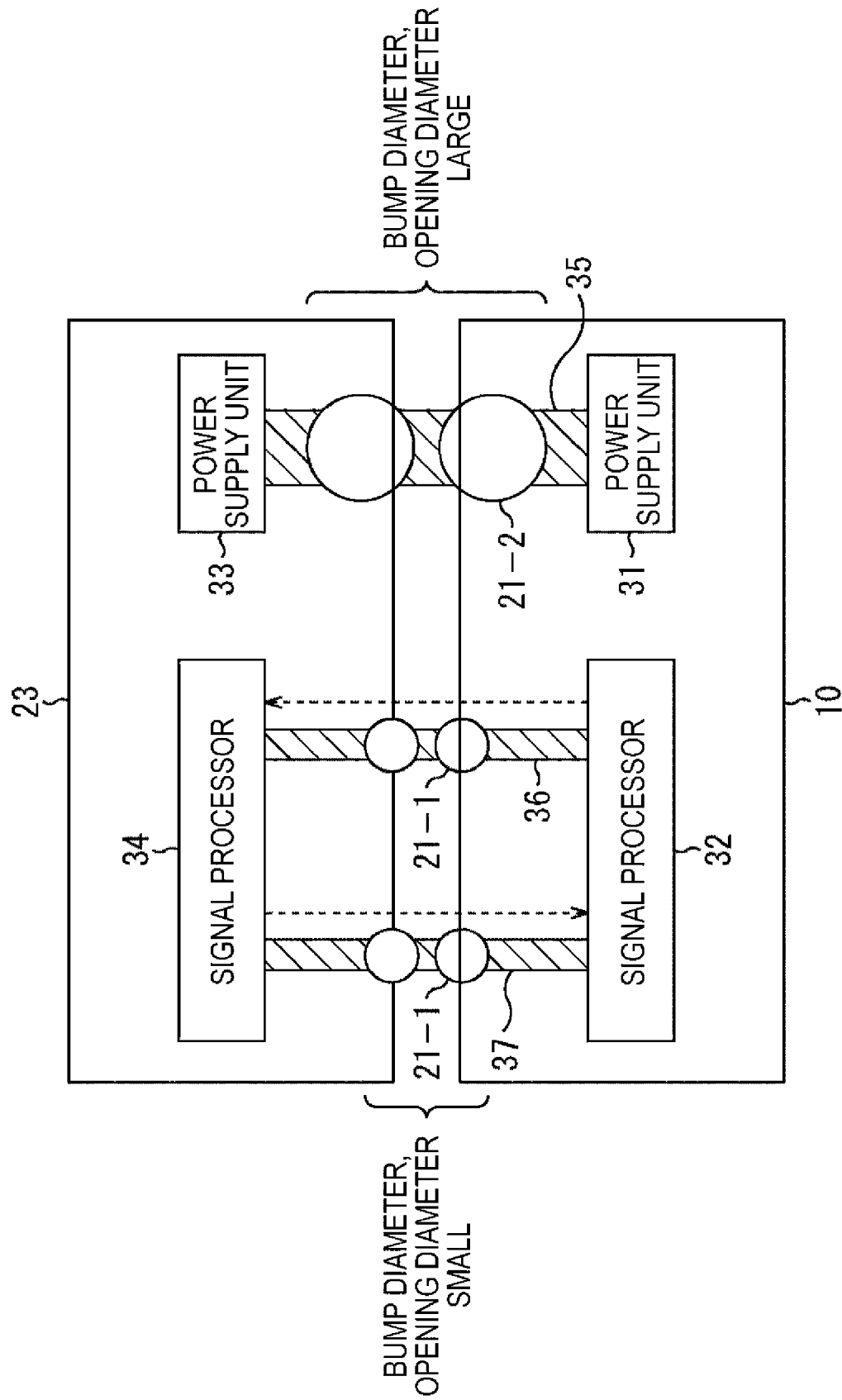
FIG. 13 A block diagram illustrating an application example of the second variation of the semiconductor device.

Next, FIG. 13 illustrates an application example of a second configuration example illustrated in FIG. 10.

In this application example, a power supply line 35 connecting a power supply unit 31 of the first semiconductor element 10 to a power supply unit 33 of a second semiconductor element 23 is connected by using the bump pad 21-1 and the microbump 24 having larger diameters. Further, signal lines 36 and 37 connecting a signal processor 32 of the first semiconductor element 10 to a signal processor 34 of the second semiconductor element 23 are connected by using the bump pad 21-2 and the microbump 24 having smaller diameters.

According to the application example illustrated in FIG. 13, the signal characteristics of the electrical signal communicated between the first and second semiconductor elements 10 and 23 may be improved and the defect regarding the power supply such as the IR drop may be inhibited.

<Application Example of Semiconductor Device>

Next, a configuration example in which the semiconductor device according to an embodiment of the present disclosure is applied to a stacked CMOS image sensor (hereinafter, referred to as a stacked CIS) is described.

Figure 14:
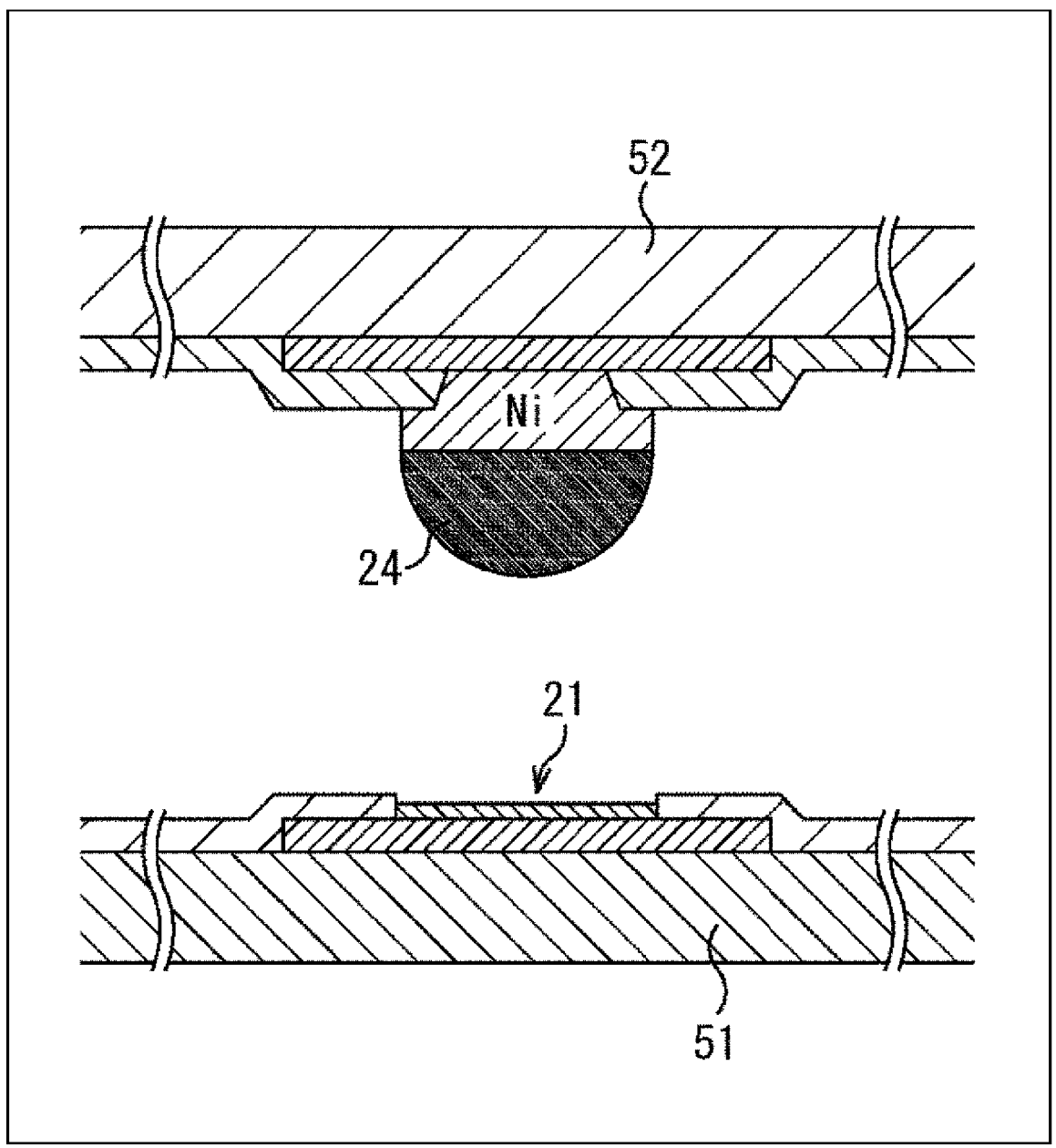
FIG. 14 A cross-sectional view illustrating a state before stacking when the semiconductor device to which the present disclosure is applied is applied to a stacked CMOS image sensor.
Figure 15:
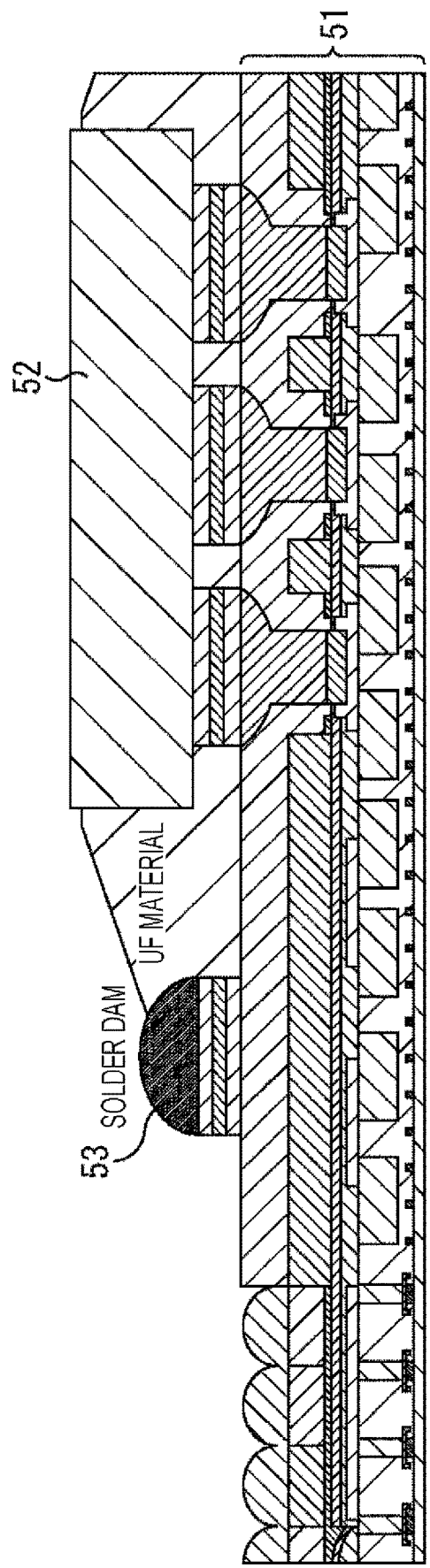
FIG. 15 A cross-sectional view illustrating a state after stacking when the semiconductor device to which the present disclosure is applied is applied to the stacked CMOS image sensor.

FIG. 14 illustrates a state before stacking of the stacked CIS to which the semiconductor device according to an embodiment of the present disclosure is applied and FIG. 15 illustrates a state after stacking of the same.

That is to say, the stacked CIS is formed such that a logic chip 52 which processes a pixel signal output from a pixel substrate 51 is stacked on the pixel substrate 51 on which a pixel unit which performs photoelectrical conversion is formed by chip on wafer (CoW) connection.

The pixel substrate 51 corresponds to the first semiconductor element 10; the bump pad 21 to be connected to the microbump 24 of the logic chip 52 is formed on a surface thereof on a light incident side. On the other hand, the logic chip 52 corresponds to the second semiconductor element 23; the microbump 24 is formed on a surface to be connected to the pixel substrate 51.

Figure 16:
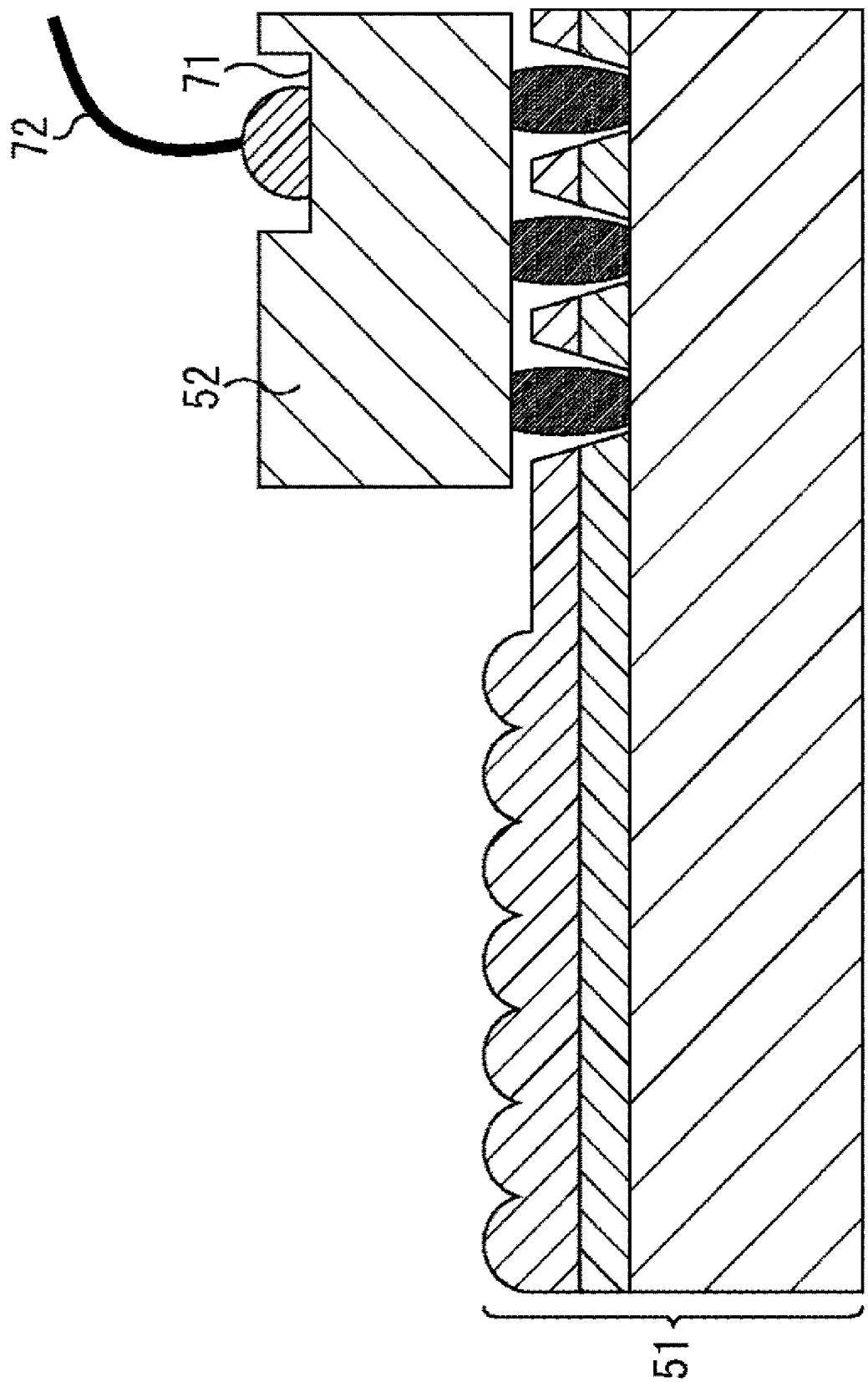
FIG. 16 A cross-sectional view illustrating a state in which an I/O is connected to a WB pad formed on a logic chip.

The pixel substrate 51 and the logic chip 52 are subjected to heating treatment in a state in which the bump pad 21 and the microbump 24 are stacked so as to be in contact with each other, so that they are electrically connected to each other. Meanwhile, on a surface opposite to the surface to which the pixel substrate 51 is connected of the logic chip 52, a WB pad 71 is formed and an I/O 72 is connected to the WB pad 71 as illustrated in FIG. 16.

As illustrated, by applying the semiconductor device according to an embodiment of the present disclosure to the stacked CMOS image sensor, it is possible to inhibit damage such as a dust defect of the pixel unit which might occur when the microbump is formed also on a side of the pixel substrate 51 to be connected. Further, a height when the pixel substrate 51 and the logic chip 52 are stacked may be made lower and sweeping unevenness of CF may be inhibited.

<Variation Regarding Formation of Bump Pad>

Next, a variation regarding formation of a bump pad is described.

Figure 17:
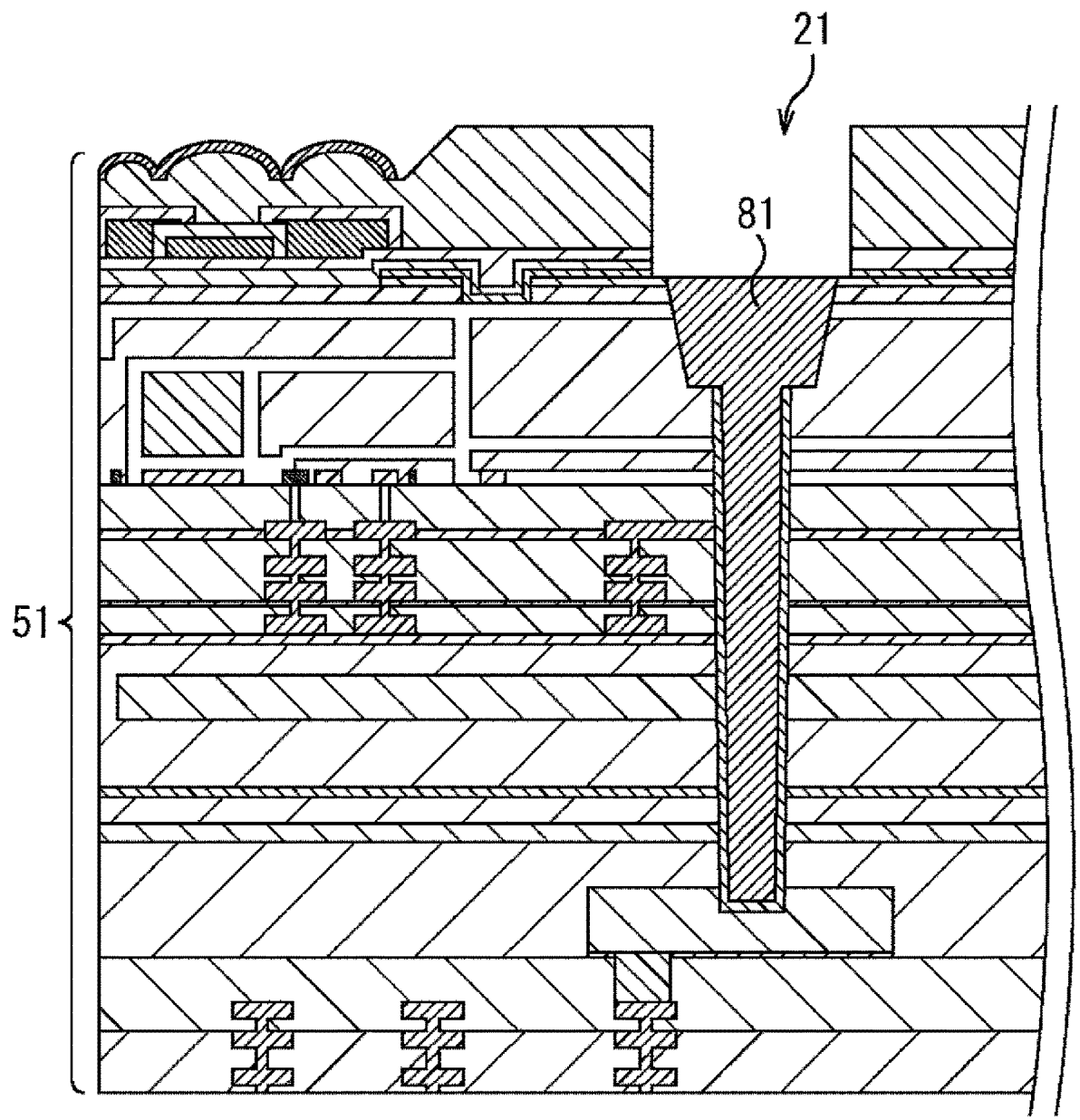
FIG. 17 A cross-sectional view illustrating a variation regarding formation of a bump pad.

FIG. 17 illustrates the variation in which an opening 21 is provided in a position of a penetration electrode 81 when the penetration electrode 81 is formed in a pixel substrate 51 and the penetration electrode 81 is made the bump pad corresponding to a microbump 24 of a logic chip 52. When the penetration electrode 81 itself is made the bump pad, formation of first to third metal layers 13 to 15 may be omitted.

Figure 18:
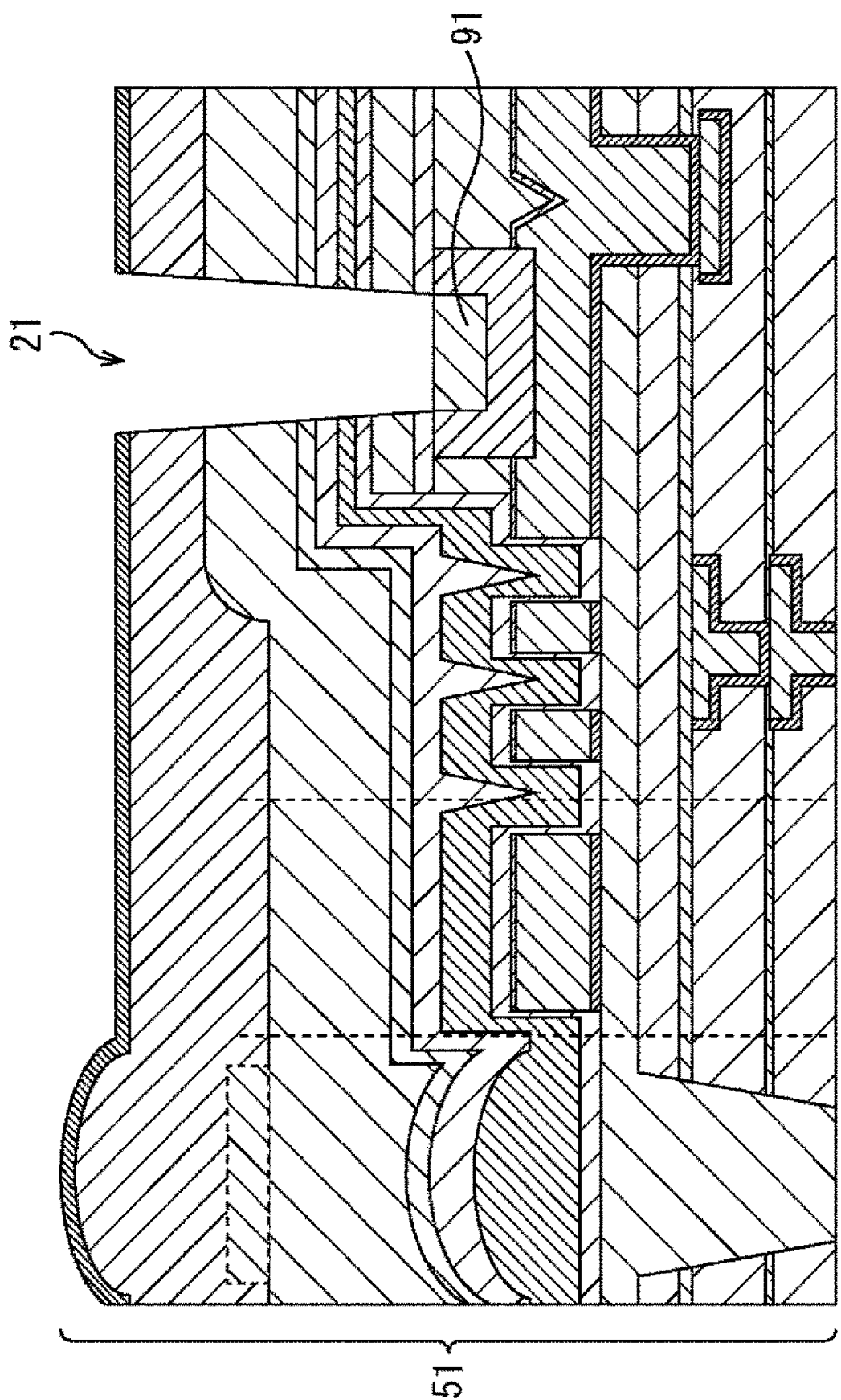
FIG. 18 A cross-sectional view illustrating a variation regarding formation of a bump pad.
Figure 19:
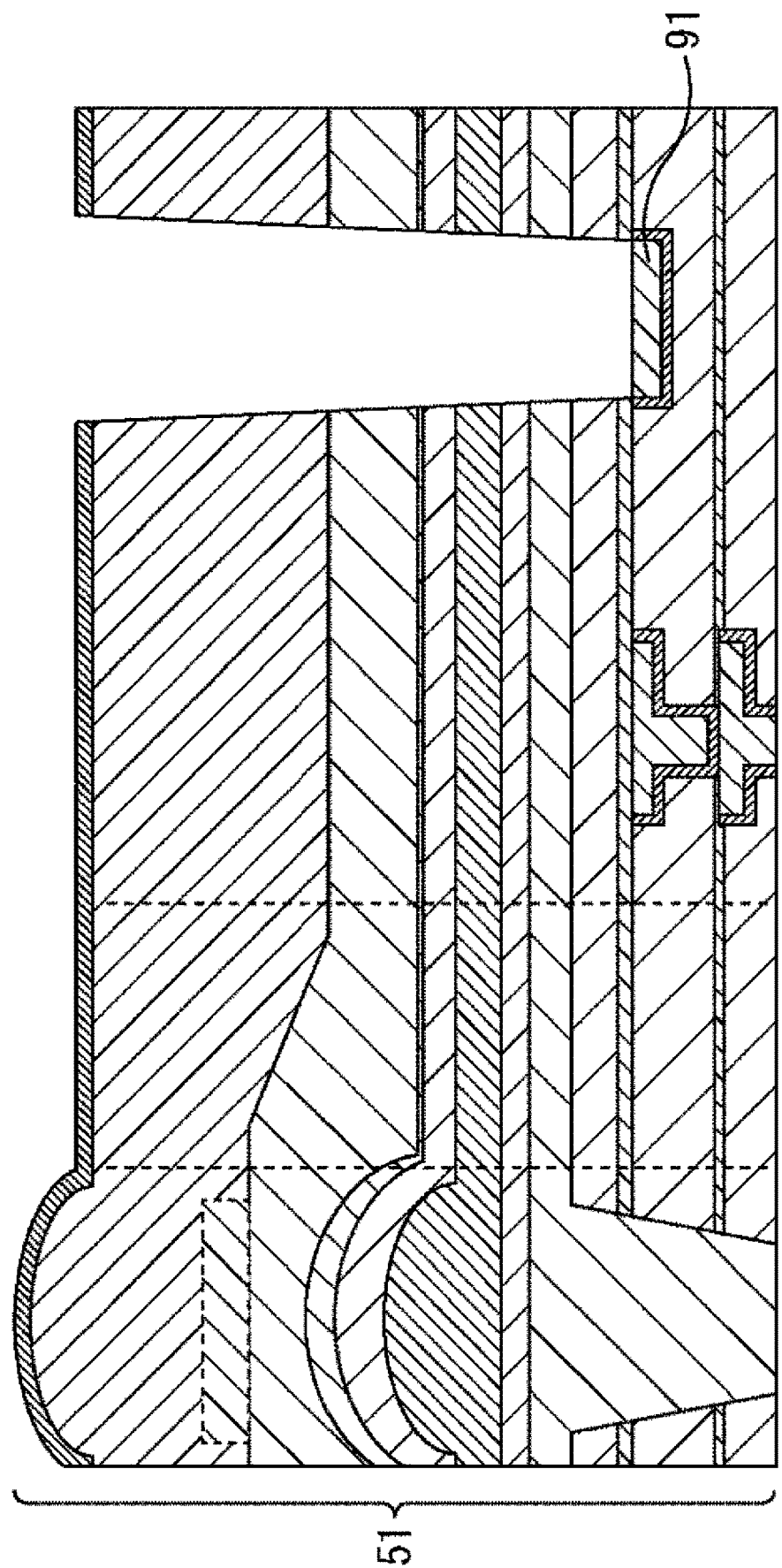
FIG. 19 A cross-sectional view illustrating a variation regarding formation of a bump pad.

FIGS. 18 and 19 illustrates a variation in which an Al PAD 11 is omitted from the pixel substrate 51 (first semiconductor element 10), the opening 21 is formed so as to reach metal wiring (Cu wiring) 91 in the pixel substrate 51, and the metal wiring 91 in the substrate is made the bump pad corresponding to the microbump 24 of the logic chip 52.

When the Al PAD 11 is omitted and the metal wiring 91 in the pixel substrate 51 is made the bump pad, sweeping unevenness in a custom process may be improved and chip shrink may be realized. Furthermore, a height of the logic chip 52 may be reduced.

Meanwhile, the semiconductor device according to an embodiment of the present disclosure is applicable to all types of electronic devices in which the electrodes of the stacked semiconductor elements are connected to each other in addition to the above-described stacked CIS.

The embodiment of the present disclosure is not limited to the above-described embodiment and this may be variously changed without departing from the scope of the present disclosure.

Meanwhile, the present disclosure may also be configured as follows.

(1)

An imaging device comprising a first semiconductor element including at least one bump pad that has a concave shape, wherein the at least one bump pad includes a first metal layer and a second metal layer on the first metal layer. The imaging device includes a second semiconductor element including at least one electrode. The imaging device includes a microbump electrically connecting the at least one bump pad to the at least one electrode, wherein the microbump includes a diffused portion of the second metal layer, and wherein the first semiconductor element or the second semiconductor element includes a pixel unit.

(2)

The imaging device according to the above-described (1), wherein the microbump includes Sn-based solder and the first metal layer includes Co.

(3)

The imaging device according to the above-described (1) or (2),
wherein the at least one bump pad includes a plurality of bump pads with different diameters, and
wherein the at least one electrode includes a plurality of electrodes corresponding to the plurality of bump pads.

(4)

The imaging device according to any one of the above-described (1) to (3),
wherein the different diameters are different from each other according to an application of the plurality of electrodes to be connected.

(5)

The imaging device according to any one of the above-described (1) to (4),
wherein a diameter of the microbump corresponds to a diameter of the at least one bump pad layer.

(6)

The imaging device according to any one of the above-described (1) to (5),
wherein the at least one bump pad includes a third metal layer, and
wherein the first metal layer is on the third metal.

(7)

The imaging device according to any one of the above-described (1) to (6),
wherein an average thickness of the first metal layer is 15 nm or thicker.

(8)

The imaging device according to any one of the above-described (1) to (7),
wherein an average thickness of the third metal layer is 10 nm or thicker.

(9)

The imaging device according to any one of the above-described (1) to (8), wherein the third metal layer is formed of TiN, Ta, or TaN.

(10)

The imaging device according to any one of the above-described (1) to (9),
wherein the second metal layer is formed of Cu, Co, Ni, Pd, Au, or Pt.

(11)

The imaging device according to the above-described (1),
wherein the at least one bump pad is an opening provided on a surface of the first semiconductor element to connect the microbump to a penetration electrode in the first semiconductor element.

(12)

The imaging device according to the above-described (1),
wherein the at least one bump pad is an opening provided on a surface of the first semiconductor element to connect the microbump to a metal wiring in the first semiconductor element.

(13)

The imaging device according to the above-described (1),
wherein the first semiconductor element is the pixel unit and the second semiconductor element is a logic chip that is connected by a chip on wafer (CoW) connection to the first semiconductor element.

(14)

A method of manufacturing an imaging device, comprising:
forming at least one contact on a first substrate;
forming an insulation layer on the at least one contact;
etching the insulation layer to provide at least one opening that exposes a portion of the at least one contact;
forming at least one bump pad in the opening so that the at least one bump pad has a concave shape; and
electrically connecting the at least one bump pad to an electrode of a second substrate by diffusing a portion of the at least one bump pad into a microbump connected to the electrode.

(15)

The method according to the above-described (14),
wherein the forming the at least one bump pad includes:
forming a first metal layer on the at least one contact; and
forming a second metal layer on the first metal layer,
wherein the diffused portion of the at least one bump pad includes the second metal layer.

(16)

The method according to the above-described (15),
wherein the forming the second metal layer includes:
forming a portion of the second metal layer in the concave shape according to a first deposition process; and
forming a remaining portion of the second metal layer according to a second deposition process to fill the concave shape.

(17)

The method according to the above-described (15),
wherein the forming the at least one bump pad includes forming a third metal layer on the insulation layer before forming the first and second metal layers.

(18)

The method according to the above-described (17),
wherein the forming the at least one bump pad includes planarizing the first, second, and third metal layers such that upper surfaces of the first, second, and third metal layers are coplanar with an upper surface of the insulation layer.

(19)

The method according to the above-described (18), wherein the second metal layer is diffused into the microbump such that a tip portion of the microbump extends beyond the upper surface of the insulation layer while another portion of the microbump exists in a space between the upper surface of the insulation layer and the electrode.

(20)

The method according to the above described (18), wherein the forming the at least one bump pad includes:

forming a passivation layer on the insulation layer and the first, second, and third metal layers; and etching the passivation layer to expose the second metal layer and create the concave shape.

(21)

A semiconductor device formed of stacked semiconductor elements in which electrodes of the opposed semiconductor elements are electrically connected to each other, wherein a microbump formed of Sn-based solder is formed on an electrode of a second semiconductor element being one of the opposed semiconductor elements, and a concave bump pad opposed to the microbump is formed on an electrode of a first semiconductor element being the other of the opposed semiconductor elements connected to the electrode of the second semiconductor element through the microbump.

(22)

The semiconductor device according to the above-described (21), wherein a third metal layer diffused into the microbump and a second metal layer formed of Co are formed on the bump pad in this order from a side of the microbump.

(23)

The semiconductor device according to the above-described (21) or (22), wherein a plurality of bump pads with different diameters is provided on the first semiconductor element.

(24)

The semiconductor device according to any one of the above-described (21) to (23), wherein the diameters of the bump pads are different from each other according to application of electrodes to be connected.

(25)

The semiconductor device according to any one of the above-described (21) to (24), wherein a diameter of the microbump of the second semiconductor element corresponds to a diameter of the bump pad of the corresponding first semiconductor element.

(26)

The semiconductor device according to any one of the above-described (21) to (25), wherein the third metal layer, the second metal layer, and a first metal layer formed of TiN are formed on the bump pad in this order from the side of the microbump.

(27)

The semiconductor device according to any one of the above-described (21) to (26), wherein an average thickness of the second metal layer is 15 nm or thicker.

(28)

The semiconductor device according to any one of the above-described (21) to (27), wherein an average thickness of the first metal layer is 10 nm or thicker.

(29)

The semiconductor device according to any one of the above-described (21) to (28), wherein the first metal layer is formed of TiN, Ta, or TaN.

(30)

The semiconductor device according to any one of the above-described (21) to (29), wherein the third metal layer is formed of Cu, Ni, Pd, Au, or Pt.

(31)

The semiconductor device according to the above-described (21), wherein the bump pad is formed of an opening provided from a surface of the first semiconductor element to a penetration electrode in the first semiconductor element.

(32)

The semiconductor device according to the above-described (21), wherein the bump pad is formed of an opening provided from a surface of the first semiconductor element to metal wiring in the first semiconductor element.

(33)

The semiconductor device according to the above-described (21) being a stacked CMOS image sensor in which a logic chip corresponding to the second semiconductor element is connected by CoW connection to a pixel substrate corresponding to the first semiconductor element.

(34)

A method of manufacturing a manufacturing device that manufactures a semiconductor device formed of stacked semiconductor elements in which electrodes of the opposed semiconductor elements are electrically connected to each other, the method including:

a microbump forming step of forming a microbump formed of Sn-based solder on an electrode of a second semiconductor element being one of the opposed semiconductor elements; and a bump pad forming step of forming a concave bump pad opposed to the microbump on an electrode of the first semiconductor element being the other of the opposed semiconductor elements connected to the electrode of the second semiconductor element through the microbump by the manufacturing device.

(35)

The manufacturing method according to the above-described (34), wherein the bump pad forming step forms a second metal layer formed of Co on the electrode of the first semiconductor element being the other of the opposed semiconductor elements connected to the electrode of the second semiconductor element through the microbump, forms a third metal layer diffused into the microbump on the second metal layer, brings the microbump into contact with the third metal layer, reduces an oxide film on surfaces of the third metal layer and the microbump by heating treatment under a reduction atmosphere and diffuses the third metal layer into the microbump, thereby bringing the microbump into contact with the second metal layer, and electrically connects the electrodes of the first and second semiconductor elements.

(36)

The manufacturing method according to the above-described (35), wherein the bump pad forming step further forms a passivation layer on the third metal layer of the first semiconductor element and etches the passivation layer to provide an opening in which the third metal layer is exposed.

(37)

The manufacturing method according to the above-described (35), wherein the bump pad forming step further forms a first metal layer formed of TiN on the electrode of the first semiconductor element being the other of the opposed semiconductor elements connected to the electrode of the second semiconductor element through the microbump before forming the second metal layer.

(38)

The manufacturing method according to the above-described (34), wherein the bump pad forming step forms the bump pad by providing an opening from a surface of the first semiconductor element to a penetration electrode in the first semiconductor element.

(39)

The manufacturing method according to the above-described (34), wherein the bump pad forming step forms the bump pad by providing an opening from a surface of the first semiconductor element to metal wiring in the first semiconductor element.

REFERENCE SIGNS LIST

10 First semiconductor element
11 Al PAD
12 $SiO_2$ layer
13 First metal layer
14 Second metal layer
15 Third metal layer
16 SiN layer
21 Opening (bump pad)
23 Second semiconductor element
24 Microbump
31 Power supply unit
32 Signal processor
33 Power supply unit
34 Signal processor
35 Power supply line
36, 37 Signal line
51 Pixel substrate
52 Logic chip
81 Penetration electrode
91 Cu wiring

What is claimed is:

1. An imaging device, comprising:
a first substrate;
a contact disposed on the first substrate and including a first surface that faces the first substrate and a second surface opposite the first surface;
a first insulation layer on sidewalls of the contact and including an opening that exposes the second surface of the contact;
at least one bump pad including:
  a first metal layer disposed in the opening of the first insulation layer and electrically connected to the contact; and
  a second metal layer disposed in the opening of the first insulation layer and on the first metal layer;
a second insulation layer on the first insulation layer and including an opening that exposes the second metal layer;
a second substrate including at least one electrode; and
a microbump electrically connecting the at least one bump pad to the at least one electrode and positioned in the opening in the second insulation layer, wherein the microbump includes a diffused portion of the second metal layer, and wherein the first substrate or the second substrate includes a pixel unit.

2. The imaging device according to claim 1, wherein the microbump includes Sn-based solder and the first metal layer includes Co.

3. The imaging device according to claim 2,
wherein the at least one bump pad includes a plurality of bump pads with different diameters, and
wherein the at least one electrode includes a plurality of electrodes corresponding to the plurality of bump pads.

4. The imaging device according to claim 3, wherein the different diameters are different from each other according to an application of the plurality of electrodes to be connected.

5. The imaging device according to claim 1, wherein a diameter of the microbump corresponds to a diameter of the at least one bump pad.

6. The imaging device according to claim 1,
wherein the at least one bump pad includes a third metal layer disposed in the opening of the first insulation layer, and
wherein the first metal layer is on the third metal layer.

7. The imaging device according to claim 6, wherein an average thickness of the first metal layer is 15 nm or thicker.

8. The imaging device according to claim 6, wherein an average thickness of the third metal layer is 10 nm or thicker.

9. The imaging device according to claim 6, wherein the third metal layer is formed of TiN, Ta, or TaN.

10. The imaging device according to claim 6,
wherein the second metal layer is formed of Cu, Co, Ni, Pd, Au, or Pt.

11. The imaging device according to claim 1, wherein a surface of the second metal layer is coplanar with a surface of the first insulation layer.

12. The imaging device according to claim 1, wherein the first insulation layer contacts the second surface of the contact.

13. The imaging device according to claim 1, wherein the first substrate is the pixel unit and the second substrate is a logic chip that is connected by a chip on wafer (CoW) connection to the first substrate.

14. A method of manufacturing an imaging device, comprising:
forming at least one contact on a first substrate, the at least one contact having a first surface that faces the first substrate and a second surface opposite the first surface;
forming a first insulation layer on the at least one contact, the first insulation layer being in contact with sidewalls of the at least one contact;
etching the first insulation layer to provide at least one first opening that exposes a portion of the at least one contact;
forming at least one bump pad in the at least one first opening of the first insulation layer;
forming a second insulation layer on the first insulation layer and the at least one bump pad;
etching the second insulation layer to provide at least one second opening that exposes the at least one bump pad; and
electrically connecting the at least one bump pad to an electrode of a second substrate by positioning a microbump connected to the electrode in the at least one second opening of the second insulation layer and by diffusing a portion of the at least one bump pad into the microbump, wherein the first substrate or the second substrate includes a pixel unit.

15. The method of claim 14, wherein the forming the at least one bump pad includes:
forming a first metal layer on the at least one contact in the at least one first opening; and
forming a second metal layer on the first metal layer, wherein the diffused portion of the at least one bump pad includes the second metal layer.

16. The method of claim 15, wherein the forming the second metal layer includes:
forming a portion of the second metal layer in the at least one first opening of the first insulation layer according to a first deposition process; and
forming a remaining portion of the second metal layer according to a second deposition process to fill the at least one first opening of the first insulation layer.

17. The method of claim 15, the forming the at least one bump pad includes forming a third metal layer in the at least one first opening of the first insulation layer before forming the first and second metal layers.

18. The method of claim 17, wherein the forming the at least one bump pad includes planarizing the first, second, and third metal layers such that a surface of the second metal layer is coplanar with a surface of the first insulation layer.

19. The method of claim 18, wherein the second metal layer is diffused into the microbump such that a tip portion of the microbump extends beyond the upper surface of the first insulation layer while another portion of the microbump exists in a space between the upper surface of the first insulation layer and the electrode.

20. The method of claim 18, wherein first insulation layer contacts the second surface of the at least one contact.

* * * * *